(12) United States Patent
Kim et al.

(10) Patent No.: US 7,794,820 B2
(45) Date of Patent: *Sep. 14, 2010

(54) PRINTED CIRCUIT BOARD AND FABRICATING METHOD OF THE SAME

(75) Inventors: Dong Sun Kim, Gyunggi-do (KR); Taehoon Kim, Gyunggi-do (KR); Jong Seok Song, Seoul (KR); Sam Jin Her, Gyunggi-do (KR); Jun Heyoung Park, Gyunggi-do (KR)

(73) Assignee: Samsung Electro-Mechanics Co., Ltd., Suwon (KR)

( * ) Notice: Subject to any disclaimer, the term of this patent is extended or adjusted under 35 U.S.C. 154(b) by 236 days.

This patent is subject to a terminal disclaimer.

(21) Appl. No.: 11/878,165

(22) Filed: Jul. 20, 2007

(65) Prior Publication Data

US 2008/0038523 A1 Feb. 14, 2008

(30) Foreign Application Priority Data

Jun. 20, 2006 (KR) ...................... 10-2006-0055462

(51) Int. Cl.
*B32B 15/00* (2006.01)
(52) U.S. Cl. ...................... 428/209; 428/901; 174/257; 174/259; 174/266
(58) Field of Classification Search ................. 428/209; 174/255–258, 266, 259
See application file for complete search history.

(56) References Cited

U.S. PATENT DOCUMENTS

| | | | | |
|---|---|---|---|---|
| 3,099,608 A | * | 7/1963 | Radovsky et al. | 205/123 |
| 3,434,939 A | * | 3/1969 | Brown et al. | 205/125 |
| 3,560,257 A | * | 2/1971 | Schneble, Jr. et al. | 428/137 |
| 3,610,811 A | * | 10/1971 | O'Keefe | 174/262 |
| 3,840,986 A | | 10/1974 | Schmidtke et al. | |
| 4,521,262 A | * | 6/1985 | Pellegrino | 156/150 |
| 4,581,301 A | * | 4/1986 | Michaelson | 428/551 |
| 4,671,854 A | * | 6/1987 | Ishikawa et al. | 216/18 |
| 4,689,110 A | | 8/1987 | Leibowitz | |

(Continued)

FOREIGN PATENT DOCUMENTS

CN 1988768 A 6/2007

(Continued)

OTHER PUBLICATIONS

Korean Patent Office Action, mailed May 28, 2007 and issued in corresponding Korean Patent Application No. 10-2006-0055462.

(Continued)

*Primary Examiner*—Cathy Lam (57) ABSTRACT

Disclosed herein are a printed circuit board and a fabrication method thereof, which can improve electrical properties, shorten processing time, and reduce the thickness of a chip package by achieving an ultra-thin fine circuit pattern. The printed circuit board includes an insulating material; a via-hole formed in a given location of the insulating material; a copper seed layer formed through ion beam surface treatment and vacuum deposition on the surface of the insulating material having the via-hole formed therein; and a copper pattern plating layer formed on a given region of the insulating material, which has the copper seed layer formed thereon, and in the via-hole.

5 Claims, 5 Drawing Sheets

U.S. PATENT DOCUMENTS

| | | | |
|---|---|---|---|
| 4,830,880 A * | 5/1989 | Okubi et al. | 427/98.1 |
| 4,886,681 A | 12/1989 | Clabes et al. | |
| 4,895,752 A | 1/1990 | McEwen | |
| 4,959,119 A * | 9/1990 | Lantzer | 216/65 |
| 5,028,513 A * | 7/1991 | Murakami et al. | 430/315 |
| 5,243,142 A * | 9/1993 | Ishikawa et al. | 174/262 |
| 5,252,195 A * | 10/1993 | Kobayashi et al. | 205/126 |
| 5,441,814 A * | 8/1995 | Gunji et al. | 428/457 |
| 6,194,076 B1 | 2/2001 | Matienzo et al. | |
| 6,630,743 B2 | 10/2003 | Magnuson et al. | |
| 6,881,991 B2 | 4/2005 | Aoyama et al. | |
| 7,601,419 B2 | 10/2009 | Song et al. | |
| 2007/0261234 A1 | 11/2007 | Song et al. | |

FOREIGN PATENT DOCUMENTS

| | | |
|---|---|---|
| DE | 2 147 573 | 10/1972 |
| DE | 10 2007 008 508 | 11/2007 |
| GB | 2109166 | 5/1983 |
| JP | 07-323501 | 12/1995 |
| JP | 09-003220 | 1/1997 |
| JP | 2000-294922 | 10/2000 |
| JP | 2001-251040 A | 9/2001 |
| JP | 2004-082444 | 3/2004 |
| JP | 2004-152915 | 5/2004 |
| KR | 1998-068853 | 10/1998 |
| KR | 2002-0028597 | 4/2002 |

OTHER PUBLICATIONS

Office Action issued in corresponding German Patent Application No. 10 2007 033 488.7, mailed on Jan. 28, 2008.
Korean Office Action, dated May 15, 2007, issued in Korean Application No. 2006-0063770.
Japanese Patent Office Action, mailed Apr. 14, 2009, issued in Japanese Patent Application No. 2006-340387.
U.S. Patent Office Action, mailed Nov. 26, 2008, issued in U.S. Appl. No. 11/585,276.
U.S. Patent Office Action, mailed Sep. 19, 2008, issued in U.S. Appl. No. 11/585,276.
U.S. Patent Notice of Allowance, mailed Jun. 12, 2009, issued in U.S. Appl. No. 11/585,276.
U.S. Patent Supplemental Notice of Allowability, mailed Jun. 27, 2009, issued in U.S. Appl. No. 11/585,276.
Japanese Office Action dated Dec. 1, 2009 and issued in corresponding Chinese Patent Application 2007-196204.

* cited by examiner

PRINTED CIRCUIT BOARD AND FABRICATING METHOD OF THE SAME

BACKGROUND OF THE INVENTION

1. Field of the Invention

The present invention relates to a printed circuit board and a fabrication method thereof, which can improve electrical properties, shorten processing time, and reduce the thickness of a chip package by achieving an ultra-thin fine circuit pattern.

2. Description of the Prior Art

As semiconductor chip manufacturing technology has advanced, the development of technology for the fabrication of package boards on which semiconductor chips are mounted has been actively conducted.

Specifically, after the middle of the 1990s, ball grid arrays (BGAs), which adopt a wire bonding process to connect ICs with boards, were commonly used. However, due to an increase in the number of I/O pins of semiconductor ICs, these methods have a limitation in that it is impossible to mount high-speed, high-performance ICs having small sizes.

Thus, technology of using flip chip interconnects to electrically connect ICs with boards was recently developed. Package products mounted on boards using the flip chip interconnect technology are collectively called "FCIP" (Flip Chip in Package).

It is known that, in the case of substrates for such FICP, the formation of high-density multilayer circuits having a circuit line width of less than 35 μm/35 μm is required. Methods for forming such HDI (high-density interconnection) may include laser build-up welding.

In this method, BT, FR-4 or other resins are impregnated into woven glass fabric to make a core. On both sides of such a core, a copper foil is laminated to a thickness of 18-35 μm to form an inner layer circuit, and then a subtractive process or a semi-additive process is performed to fabricate a printed circuit board.

The method for forming build-up patterns on a board having an inner layer circuit pattern formed thereon is shown in FIGS. 1A to 1F.

FIGS. 1A to 1F are process cross-sectional views illustrating the prior method for fabricating a printed circuit board.

Figure 1A:
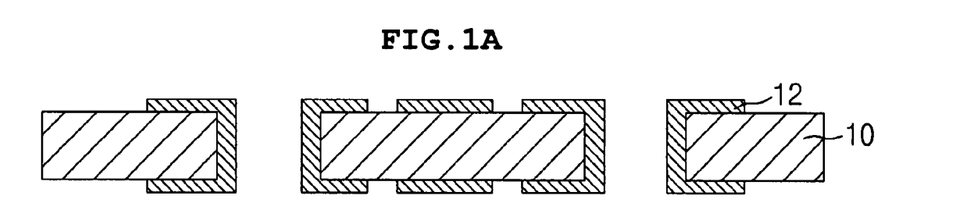
FIG. 1A to 1F are process cross-sectional views illustrating a method for fabricating a printed circuit board according to the prior art.

As shown in FIG. 1A, an inner layer circuit pattern 12 is first formed on both sides of a core 10 using a general process.

In this respect, the core 10 is made of a copper-clad laminate (CCL), and as the insulating material of CCL, FR-4 or epoxy resin, impregnated into woven glass fabric, is mainly used.

Figure 1B:
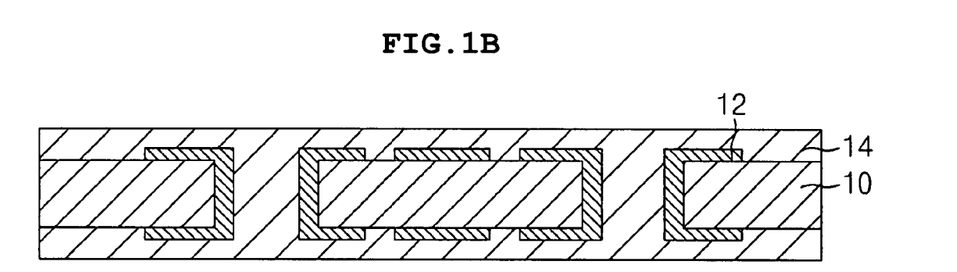

After the inner layer circuit pattern 12 is formed, as shown in FIG. 1B, an ink-type thermosetting resin 14 is applied on the core board having the inner layer circuit pattern 12 formed thereon, or a dry film-type resin is attached to the core board. Then, the applied or attached resin is cured.

Figure 1C:
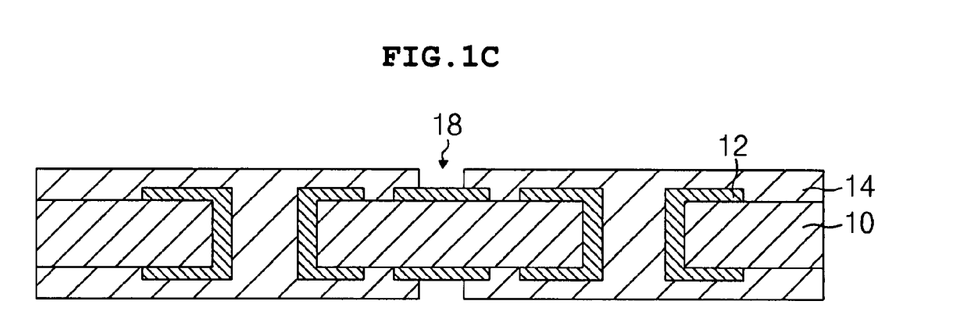

Then, as shown in FIG. 1C, a given location of the board structure is irradiated with a laser beam to form a via-hole 18.

Figure 1D:
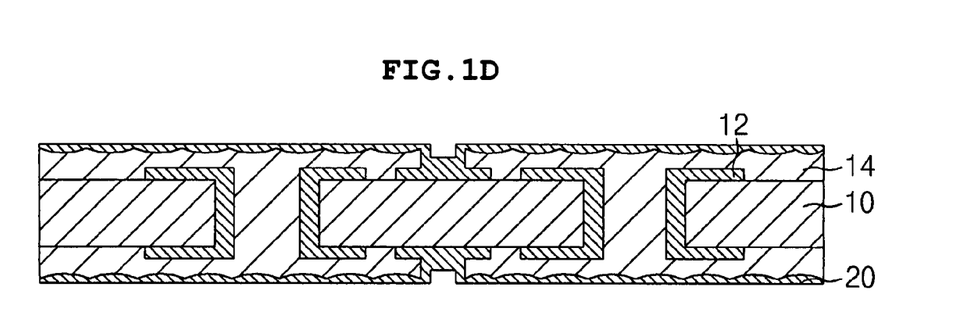

After the via-hole 18 is formed, as shown in FIG. 1D, the surface of the board having the via-hole 18 formed therein is roughened and subjected to CZ treatment. Then, a copper seed layer 20 is formed on the surface of the board using an electroless copper plating process. In this respect, the copper seed layer 20 is formed after a Ni—Cr tie-layer (not shown) is formed.

Figure 1E:
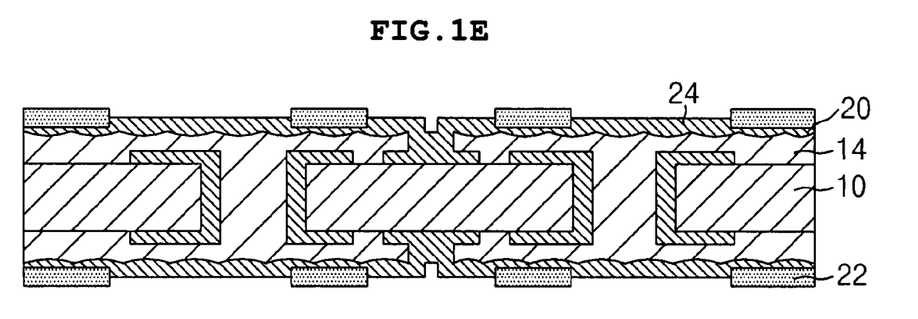

After the copper seed layer 20 is formed, a dry film 22 is attached on the copper seed layer 20, and then, as shown in FIG. 1E, the portion where a circuit pattern is to be formed is exposed through a conventional photo-etching process comprising exposure and development.

Figure 1F:
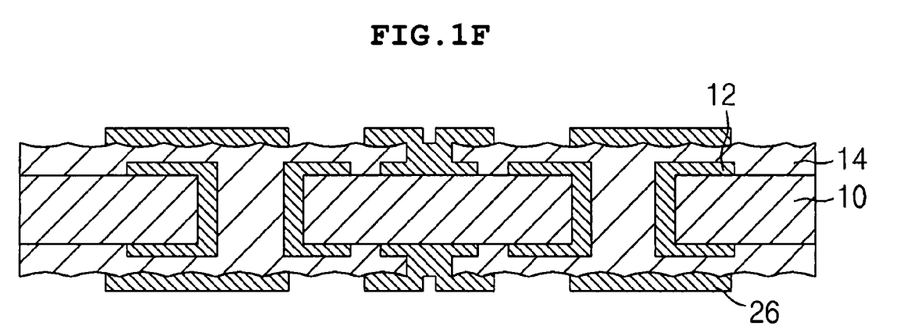

Then, a conductive layer 24 is formed using a copper electroplating process, followed by removal of the dry film 22. After the dry film 22 is removed, the portion of the copper seed layer 20 on which the conductive layer 24 was not formed is removed using a flash etching process, thus forming an outer layer circuit pattern 26 as shown in FIG. 1F.

After the outer layer circuit pattern 26 is formed, in order to form a multi-layer printed circuit board, an adhesive layer and an insulating layer are sequentially formed on the outer layer circuit pattern 26 and are pressed with a press.

Then, after the outermost layer circuit pattern is formed in the outermost layer, the outermost layer circuit pattern, which is connected to an external terminal, is exposed through a solder resist opening process, and a gold plating layer is formed on the exposed outermost layer circuit pattern.

However, this prior printed circuit board has problems in that, because FR-4 or epoxy-based insulating material having a high dielectric constant (higher than 4.5), a high loss coefficient (higher than 0.05), and a high propagation delay time (higher than 180 ps/in), is used, not only is a large amount of heat generated, but also the electrical properties are reduced, due to the reduction of signal transmission speed and the loss of the transmitted signal. Also, there is a problem in that, because CCL having resin impregnated into woven glass fabric is used in the core, the thickness of the package is increased.

Moreover, the method of fabricating the printed circuit board using sputter Flexible Copper Clad Laminate (FCCL) according to the prior art has a problem in that, because the copper seed layer is formed after the formation of the Ni—Cr tie-layer, a process of depositing the tie-layer and a process of etching the tie-layer are required, and thus a long processing time is needed.

Furthermore, the method for fabricating the printed circuit board according to the prior art has problems in that, because the insulating layer is deposited on the inner layer circuit pattern 12 using an epoxy or acryl-based adhesive layer in order to fabricate a multilayer printed circuit board, not only are a process time and process cost for forming the adhesive layer increased, but also the excellent electrical properties of the insulating layer are reduced due to the adhesive layer, and the thickness of the chip package is increased.

In addition, the method for fabricating the printed circuit board according to the prior art has a problem in that a large amount of waste, such as wastewater and contaminants, are generated in the pretreatment process, such as CZ treatment or desmearing treatment, and the wet process such as electroless copper plating for forming the copper seed layer, thus causing environmental contamination.

SUMMARY OF THE INVENTION

Accordingly, the present invention has been made in order to solve the above-described problems occurring in the prior art, and the present invention has been made in an effort to provide a printed circuit board and a fabrication method thereof, which can improve electrical properties and shorten processing time.

Also, the present invention provides a printed circuit board and a fabrication method thereof, which can reduce the thickness of a chip package by achieving an ultra-thin fine circuit pattern and reduce environmental contamination by reducing the generation of contaminants.

In one aspect of the present invention, there is provided a printed circuit board, comprising: an insulating material; a via-hole formed in a given location of the insulating material; a copper seed layer formed through ion beam surface treatment and vacuum deposition on the surface of the insulating material having the via-hole formed therein; and a copper pattern plating layer formed on a given region of the insulating material, which has the copper seed layer formed thereon, and in the via-hole.

In another aspect of the present invention, there is provided a method of fabricating a printed circuit board, comprising the steps of: providing an insulating material; (b) forming in the insulating material at least one via-hole for interlayer electrical connection; (c) ion beam treating the surface of the insulating material having the via-hole formed therein; (d) forming a copper seed layer on the surface-treated insulating material using a vacuum deposition process; and (e) plating a copper pattern on the copper seed layer to form a circuit pattern.

BRIEF DESCRIPTION OF THE DRAWINGS

The above and other features and advantages of the present invention will be more clearly understood from the following detailed description taken in conjunction with the accompanying drawings, in which.

DETAILED DESCRIPTION OF THE INVENTION

Hereinafter, a preferred embodiment of the present invention will be described in detail with reference to the accompanying drawings.

Figure 2:
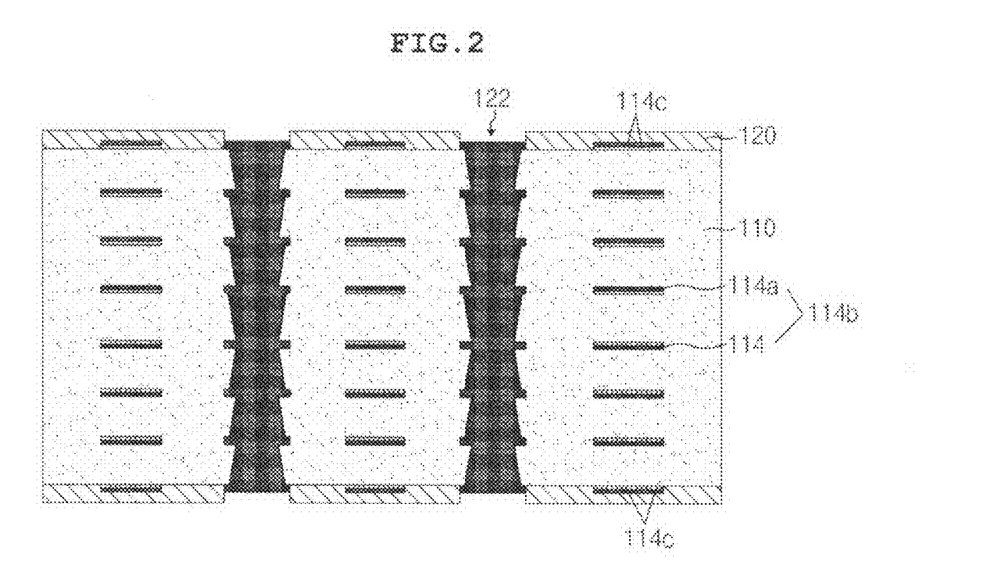
FIG. 2 shows a printed circuit board according to an embodiment of the present invention.

FIG. 2 shows a printed circuit board according to an embodiment of the present invention.

Referring to FIG. 2, the printed circuit board according to the present invention comprises a hydrophobic insulating material 110 having a surface treated with an ion beam, a seed copper layer 114 deposited on both sides of the insulating material 110 by vacuum deposition, and a copper pattern plating layer 114a formed on a given portion (circuit pattern portion) of the insulating material 110, which has the copper seed layer 114 formed thereon.

As the insulating material 110, thermoplastic polyimide, which can be deposited on itself and has good electric properties due to its low dielectric constant and low propagation delay time, is used. In this respect, the insulating material 110 is formed to a thickness of 10-50 μm, and preferably to a thickness of about 25 μm. In this insulating material 110, a plurality of via-holes is formed at a given location, and both sides of the insulating material 110 are treated with an ion beam.

The copper seed layer 114 is formed on the insulating material 110 by vacuum deposition to a thickness of less than 0.5 μm, and preferably about 10 nm-0.5 μm.

The copper pattern plating layer 114a is formed using a fill plating process on a given region (i.e., circuit pattern region) of the copper seed layer 114 and in the via-holes.

In this respect, the copper seed layer 114 and the copper pattern plating layer 114a form a circuit pattern 114b.

The printed circuit board according to the embodiment of the present invention, which has the above-described construction, may be deposited in two layers, three layers or more, depending on the intended use thereof.

FIGS. 3A to 3H are process cross-sectional views showing the method for fabricating the printed circuit board according to the embodiment of the present invention.

Figure 3A:
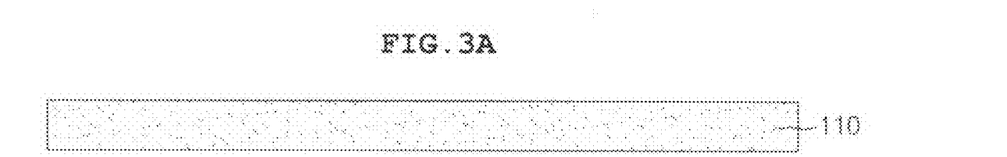
FIGS. 3A to 3H are process cross-sectional views showing a method for fabricating the printed circuit board shown in FIG. 2.

As shown in FIG. 3A, the hydrophobic insulating material 110 is first prepared. As the insulating material 110, it is most preferable that thermoplastic polyimide (TPI), which can be deposited by itself and has good electrical properties due to the low propagation delay time and low dielectric constant, as shown in Table 1 below, be used. Thus, because no additional adhesive layer is used, the total thickness of the printed circuit board is reduced, and it is possible to form a printed circuit board having increased design freedom and improved electrical properties.

TABLE 1

| Material | Dielectric constant ($\epsilon_r$) | Propagation delay time (ps/in) |
| --- | --- | --- |
| TPI | 3.1 | 148 |
| PI | 3.5 | 158 |
| Polyimide/Fiberglass | 4.2 | 174 |
| FR-4 | 4.5 | 180 |

Figure 3B:
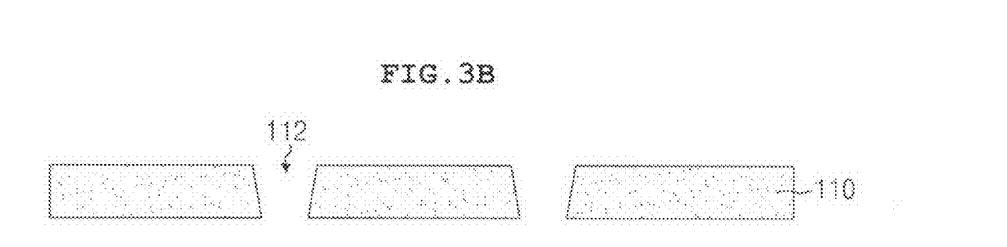

Then, as shown in FIG. 3B, the insulating material 110 is drilled with a drill to form a through-hole for interlayer electrical connection in the insulating material 110.

As the drill, a CNC drill (computer numerical control drill) or a laser drill is used.

Herein, the use of the CNC drill is suitable for forming either the via-hole of a two-sided printed circuit board or the through-hole of a multilayer printed circuit board, and the use of the laser drill is suitable for forming the via-hole of a multilayer printed circuit board.

As the laser, a YAG laser (yttrium aluminum garnet laser) or a $CO_2$ laser is used.

Then, the surface of the insulating material 110 is subjected to ion beam surface treatment. As used herein, the term "ion beam surface treatment" means making the polymer surface hydrophilic by irradiating the polymer surface with inert or reactive ions having energy, so as to excite the polymer surface and to form unstable rings in the polymer, and supplying oxygen as atmosphere gas thereto so as to form hydrophilic functional groups on the surface through the chemical reaction between the unstable rings and the oxygen gas. In this regard, the hydrophilic surface has no roughness, and thus it is advantageous in the formation of a fine circuit pattern and has an ability to form a strong semi-permanent bond with copper (Cu).

Such ion beam surface treatment is carried out in the presence of any one inert gas selected form the group consisting of Ar, $O_2$, $N_2$, Xe, $CF_4$, $H_2$, Ne, Kr, and mixed gases thereof.

In the ion beam surface treatment, although the ion dose varies depending on the material, it is preferably $10^{15}$-$10^{19}$ ions/cm$^3$ for TPI. Also, accelerating voltage is preferably 0.5-20 KeV.

Figure 3C:
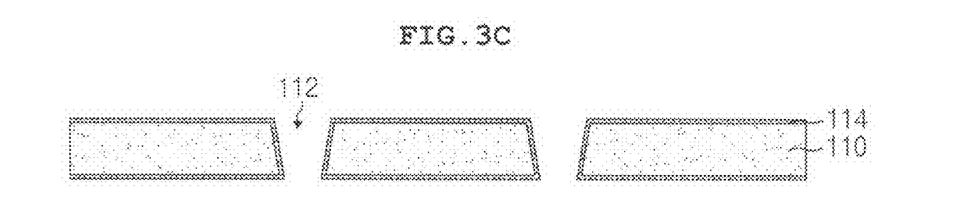

After the surface of the insulating material 110 is subjected to ion beam treatment, as shown in FIG. 3C, the copper seed layer 114 is formed to the desired thickness using a vacuum deposition process. Herein, the adhesive strength of the copper seed layer 114 to the insulating material 110 is more than 1.0 kgf/cm.

As the vacuum deposition process, any one of a sputter deposition process, a thermal evaporation process and an e-beam evaporation process is preferably used, but any method known in the art may also be used without particular limitation.

The thickness of the formed copper seed layer 114 is less than 0.5 μm, and preferably 10 nm to 0.5 μm.

Such an ion beam surface treatment process and copper sputtering process are dry processes, which are environment-friendly, because these processes do not generate waste solutions, unlike the prior wet process in which the copper seed layer is formed by chemical copper deposition after CZ (desmearing) treatment.

Also, in the prior process of forming the copper seed layer, a tie-layer etching process is required, because the seed layer is formed by Cu sputtering after sputtering of a Ni—Cr tie-layer to increase the adhesive strength between the insulating material and the copper seed layer. However, in the present invention, the tie-layer etching process is not required to simplify processes, because the copper seed layer is directly formed through the ion beam pretreatment process.

After the copper seed layer 114 is formed, a dry film 116 is deposited on the copper seed layer 114.

Next, an artwork film having a circuit pattern formed thereon is placed on the dry film 116, and then the dry film 116 is cured by exposure to UV light.

Figure 3D:
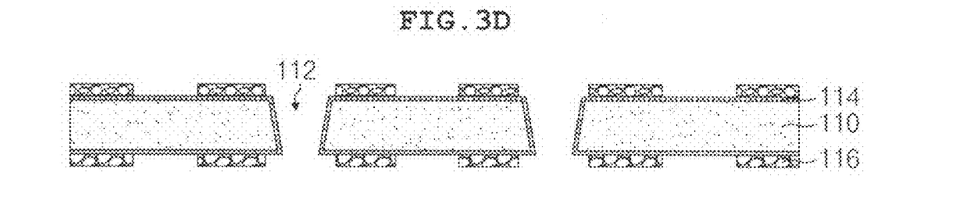

After the dry film 116 is cured, it is developed using a developer. As the developer, 1% $Na_2CO_3$ or $K_2CO_3$ is used.

As a result, as shown in FIG. 3D, the cured portion (where no circuit pattern is formed) is not dissolved in the developer, and the uncured portion (where the circuit pattern is formed) is dissolved in the developer and removed.

That is, the portion of the dry film 116 where the copper pattern plating layer is to be formed in a subsequent process is removed.

Figure 3E:
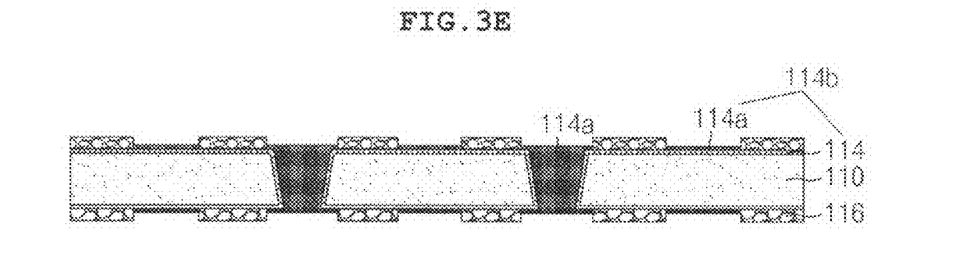

Subsequently, as shown in FIG. 3E, the copper pattern plating layer 114a is formed through a fill plating process.

Figure 3F:
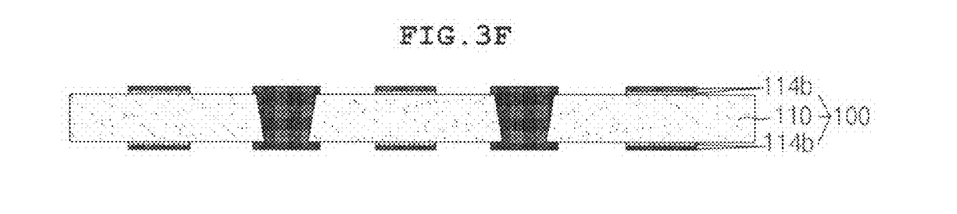

After the copper pattern plating layer 114a is formed, as shown in FIG. 3F, the dry film 116 is removed, and then a portion of the copper seed layer 114 except for the inner layer circuit pattern 114b is removed by flash etching.

In this respect, the inner layer circuit pattern 114b consists of the copper seed layer 114 and the copper pattern plating layer 114a.

Figure 3G:
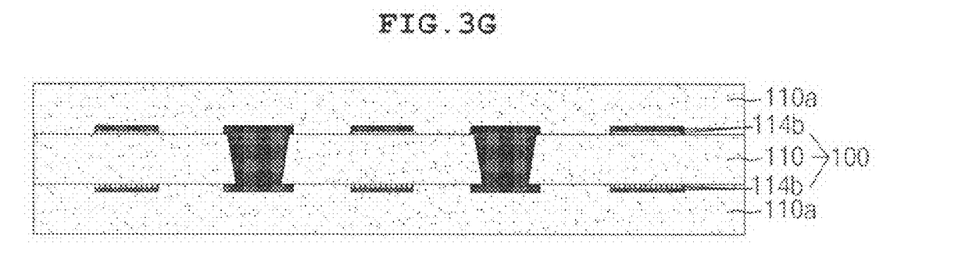

After the inner layer circuit pattern 114b is formed, as shown in FIG. 3G, an insulating material 110a is deposited on both sides of the inner substrate 100 having the inner layer circuit pattern 114a formed therein using a high-temperature press. Herein, the insulating material 110a is deposited on both sides of the inner substrate 100 with the high-temperature press at a temperature lower than about 300° C. and a pressure of 20-30 kg/cm$^2$.

As the insulating material 110a, TPI, which can be deposited on itself, is used in the present invention. For this reason, in the present invention, the insulating material 110a can be deposited directly on both sides of the inner substrate 100 having the inner layer circuit pattern 114a formed therein, without any adhesive layer, as used in the prior art.

Accordingly, it is possible to prevent electrical properties from deteriorating due to the adhesive layer and to reduce the thickness of the printed circuit board.

After the insulating material 110a is deposited on both sides of the inner substrate 100, the processes of forming the inner circuit pattern 114a as shown in FIGS. 3B to 3F are repeated to deposit a plurality of layers. Herein, the printed circuit board may be deposited in two layers, three layers or more depending on the intended use thereof.

Figure 3H:
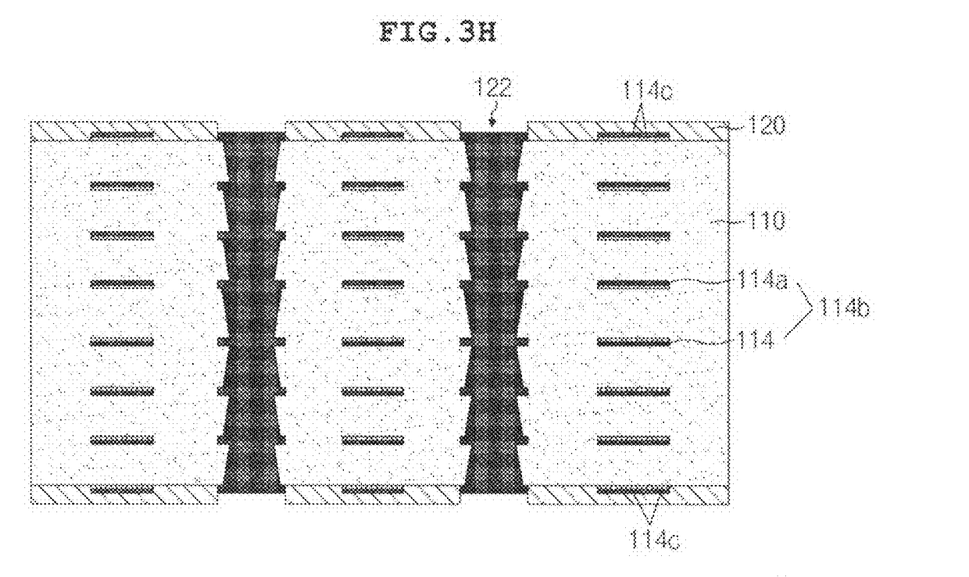

After the printed circuit board is deposited in a plurality of layers, the outer layer circuit pattern 114c is formed on the outermost layer, and the outer layer circuit pattern 114c is formed thereon, followed by the application of a solder resist 120.

Then, as shown in FIG. 3H, a portion of the solder resist 120 on a pad region 122, which is connected with an external terminal for power supply and signal exchange, is removed through a conventional solder resist opening process to expose the outer layer circuit pattern 114c, which is connected with the external terminal.

As described above, in the embodiment of the printed circuit board and the fabrication method thereof according to the embodiment of the present invention, because TPI, having a low propagation delay time and a low dielectric constant, is used as the insulating material 100, design freedom can be increased, and electrical properties can also be improved.

Also, in the embodiment of the printed circuit board and the fabrication method thereof according to the embodiment of the present invention, because the core 100 having no woven glass fiber impregnated therein is used as a core material, the thickness of the printed circuit board can be reduced, resulting in a reduction in the thickness of a chip package.

Moreover, in the embodiment of the printed circuit board and the fabrication method thereof according to the embodiment of the present invention, the copper seed layer 114 is formed on both sides of the insulating material 110 through vacuum deposition, after the surface of the insulating material 110 is treated with an ion beam. Accordingly, the use of the tie-layer to increase the adhesive strength between the insulating material 110 and the copper seed layer 114 is eliminated, and thus the processing time and process cost can be reduced due to the elimination of the tie-layer deposition process and the tie-layer etching process.

Furthermore, in the embodiment of the printed circuit board and the fabrication method thereof according to the embodiment of the present invention, because the insulating material is deposited on both sides of the inner substrate without any adhesive layer, it is possible to prevent electrical properties from deteriorating due to the adhesive layer, and the thickness of the printed circuit board can be reduced by the thickness of the adhesive layer, resulting in a reduction in the thickness of a chip package.

Also, in the embodiment of the printed circuit board and the fabrication method thereof according to the embodiment of the present invention, because the copper seed layer can be formed to a thickness of less than 0.5 μm using a vacuum deposition process, there is no under-cutting phenomenon, making it possible to form an ultra-fine circuit. Thus, the printed circuit board according to the present invention can be used for IT products, including camcorders, mobile phones, cameras, MP3 and PMPs.

In addition, in the embodiment of the printed circuit board and the fabrication method thereof according to the embodiment of the present invention, because the copper seed layer 114 is formed without using a pretreatment process, such as CZ treatment or desmearing treatment, and chemical copper deposition, waste, such as wastewater or contaminants, is not generated, and thus environmental contamination can be prevented.

The inventive printed circuit board, which is fabricated as described above, is not specifically limited only to a BGA (ball grid array), an FCBGA (flip chip BGA), HDI (high density interconnection), a UT-CSP (ultra thin-chip scale package) and the like, but may be applied to all products in which a fine circuit is to be formed.

As described above, according to the present invention, design freedom can be increased, because TPI, having a low propagation delay time and a low dielectric constant, is used as the insulating material. Also, because the copper seed layer can be formed to a thickness of less than 0.5 μm using the vacuum deposition process, there is no under-cutting phenomenon, making it possible to form an ultra-fine circuit.

Moreover, according to the present invention, because a core having no glass fiber impregnated therein is used as a core material, the thickness of the printed circuit board can be reduced, resulting in a reduction in the thickness of a chip package.

Furthermore, according to the present invention, because the copper seed layer is formed without using a pretreatment process, such as CZ treatment or desmearing treatment, and chemical copper deposition, waste, such as wastewater or contaminants, is not generated, and thus environmental contamination can be prevented.

Also, according to the present invention, because the formation of the adhesive layer for the adhesive strength of the insulating material and the copper seed layer is eliminated by forming the copper seed layer directly on the insulating material using the vacuum deposition process, it is possible to prevent the electrical properties from being deteriorated due to the adhesive layer, thus improving the electrical properties of the printed circuit board.

In addition, according to the present invention, because the insulating material is deposited on both sides of the inner substrate without any adhesive layer, the adhesive layer deposition process and the adhesive layer etching process can be eliminated, thus simplifying processes. Also, because the adhesive layer is not formed, the thickness of a chip package can be reduced.

Although the preferred embodiment of the present invention has been described for illustrative purposes, those skilled in the art will appreciate that various modifications, additions and substitutions are possible, without departing from the scope and spirit of the invention as disclosed in the accompanying claims.

What is claimed is:

1. A printed circuit board, comprising:
   an insulating material of thermal plastic polyimide;
   a via-hole formed in a given location of the insulating material;
   a copper seed layer formed through ion beam surface treatment and vacuum deposition on the surface of the insulating material having the via-hole formed therein; and
   a copper pattern plating layer formed on a given region of the insulating material, which has the copper seed layer formed thereon, and in the via-hole.

2. The printed circuit board of claim 1, wherein the insulating material has a thickness of 10-50 μm.

3. The printed circuit board of claim 2, wherein the thickness of the insulating material is 25 μm.

4. The printed circuit board of claim 1, wherein the copper seed layer has a thickness of less than 0.5 μm.

5. The printed circuit board of claim 4, wherein the thickness of the copper seed layer is 10 nm to 0.5 μm.

* * * * *